United States Patent
Park et al.

(10) Patent No.: US 9,263,560 B2
(45) Date of Patent: Feb. 16, 2016

(54) POWER SEMICONDUCTOR DEVICE HAVING REDUCED GATE-COLLECTOR CAPACITANCE

(71) Applicant: SAMSUNG ELECTRO-MECHANICS CO., LTD., Suwon-Si, Gyeonggi-Do (KR)

(72) Inventors: Jae Hoon Park, Suwon-Si (KR); Jae Kyu Sung, Suwon-Si (KR); In Hyuk Song, Suwon-Si (KR); Ji Yeon Oh, Suwon-Si (KR); Dong Soo Seo, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/273,341

(22) Filed: May 8, 2014

(65) Prior Publication Data

US 2015/0123164 A1 May 7, 2015

(30) Foreign Application Priority Data

Nov. 1, 2013 (KR) .................... 10-2013-0132494

(51) Int. Cl.
| | |
|---|---|
| H01L 29/00 | (2006.01) |
| H01L 29/739 | (2006.01) |
| H01L 29/66 | (2006.01) |
| H01L 29/78 | (2006.01) |
| H01L 29/74 | (2006.01) |
| H01L 29/06 | (2006.01) |
| H01L 29/423 | (2006.01) |

(52) U.S. Cl.
CPC ........ *H01L 29/7397* (2013.01); *H01L 29/0696* (2013.01); *H01L 29/4236* (2013.01); *H01L 29/66348* (2013.01); *H01L 29/66734* (2013.01); *H01L 29/74* (2013.01); *H01L 29/7813* (2013.01); *H01L 29/7827* (2013.01)

(58) Field of Classification Search
CPC ............ H01L 29/7813; H01L 29/1095; H01L 29/66734; H01L 29/7397; H01L 29/0696; H01L 29/4236; H01L 29/66348
See application file for complete search history.

(56) References Cited

U.S. PATENT DOCUMENTS

| | | | |
|---|---|---|---|
| 2006/0027861 A1* | 2/2006 | Takaishi | 257/330 |
| 2007/0114598 A1 | 5/2007 | Hotta et al. | |
| 2008/0164516 A1* | 7/2008 | Darwish | 257/329 |
| 2012/0098055 A1* | 4/2012 | Darwish et al. | 257/330 |
| 2012/0175699 A1* | 7/2012 | Hsieh | 257/332 |

(Continued)

FOREIGN PATENT DOCUMENTS

| | | |
|---|---|---|
| JP | 2005-210047 A | 8/2005 |
| KR | 10-2005-0067227 A | 6/2005 |
| WO | 2004/042825 A1 | 5/2004 |

*Primary Examiner* — Ngan Ngo
(74) *Attorney, Agent, or Firm* — McDermott Will & Emery LLP

(57) ABSTRACT

A power semiconductor device may include a first conductivity type first semiconductor region; a second conductivity type second semiconductor region formed on an upper portion of the first semiconductor region; a first conductivity type third semiconductor region formed in an upper inner side of the second semiconductor region; a trench gate formed to penetrate through a portion of the first semiconductor region from the third semiconductor region; and a first conductivity type fourth semiconductor region formed below the second semiconductor region while being spaced apart from the trench gate.

6 Claims, 3 Drawing Sheets

(56) References Cited

U.S. PATENT DOCUMENTS

| | | | |
|---|---|---|---|
| 2012/0261714 A1* | 10/2012 | Taketani et al. | 257/139 |
| 2013/0069146 A1* | 3/2013 | Okumura et al. | 257/330 |
| 2014/0042531 A1* | 2/2014 | Park et al. | 257/330 |
| 2014/0048872 A1* | 2/2014 | Hsieh | 257/331 |
| 2014/0054682 A1* | 2/2014 | Padmanabhan et al. | 257/330 |
| 2014/0077290 A1* | 3/2014 | Hsieh | 257/330 |
| 2015/0008478 A1* | 1/2015 | Cheng et al. | 257/139 |

* cited by examiner

POWER SEMICONDUCTOR DEVICE HAVING REDUCED GATE-COLLECTOR CAPACITANCE

CROSS-REFERENCE TO RELATED APPLICATION

This application claims the benefit of Korean Patent Application No. 10-2013-0132494 filed on Nov. 1, 2013, with the Korean Intellectual Property Office, the disclosure of which is incorporated herein by reference.

BACKGROUND

The present disclosure relates to a power semiconductor device and a method of fabricating the same allowing for a significant reduction in parasitic capacitance while having a low on resistance.

An insulated gate bipolar transistor (IGBT) is a transistor which has a gate fabricated using metal oxide silicon (MOS) and has bipolar properties implemented therein by a p-type collector layer being formed on a rear surface thereof.

Since power metal oxide silicon field emission transistors (MOSFETs) were developed, such MOSFETs have been used in applications in which fast switching characteristics are required.

However, since MOSFETs have structural limitations, a bipolar transistor, a thyristor, a gate turn-off thyristor (GTO), and the like have been used in applications in which high voltage is required.

IGBTs have features such as a low forward loss and fast switching speeds, and therefore, the use thereof has tended to be expanded into applications for which typical thyristors, bipolar transistors, metal oxide silicon field emission transistors (MOSFETs), and the like may not be appropriate.

Describing an operational principle of the IGBT, in a case in which an IGBT device is turned on, when an anode has a voltage higher than that applied to a cathode, and a voltage higher than a threshold voltage of the IGBT device is applied to a gate electrode, a polarity of a surface of a p-type well layer, formed at a lower end of the gate electrode is inverted, and thus an n-type channel is formed.

An electronic current which is injected into a drift region through the channel induces an injection of hole current from a high-concentration p-type collector layer disposed below the IGBT device, in a similar manner to a base current of a bipolar transistor.

Due to an injection of minor carriers at high concentration, a conductivity modulation in which conductivity in the drift region is increased by several times to hundreds of times may occur.

Unlike MOSFETs, IGBTs have a very small resistance component in the drift region due to such conductivity modulation, and therefor may be used in at very high voltages.

Various technologies for considerably increasing a conductivity modulation phenomenon have been developed.

For example, a technology of considerably increasing the conductivity modulation phenomenon using a phenomenon in which holes are accumulated by forming a high concentration n-type semiconductor region below a p-type well layer exists.

As such, the high-concentration n-type semiconductor region formed below the p-type well layer is known as a hole accumulation layer.

When such a hole accumulation layer is formed, the amount of accumulated holes is considerably increased and thus, the conductivity modulation phenomenon may occur to a significant degree, but the holes accumulated in the hole accumulation layer affect an input signal of a trench gate.

That is, the trench gate is affected by the hole accumulation layer and therefore gate noise occurs.

Such gate noise has a negative effect on a stable supply of current.

In particular, when a switching frequency is high, a range of variation in current due to the gate noise may be very high in turn.

Therefore, a technology for reducing the gate noise while reducing resistance by considerably increasing the conductivity modulation phenomenon is required.

Patent Document 1 of the following Related Art Document relates to a semiconductor device and a method of fabricating the same.

In detail, Patent Document 1 discloses a structure for reducing switching loss; however, unlike the present disclosure, an n-type region is formed to contact the trench gate.

RELATED ART DOCUMENT

Patent Document (Patent Document 1) Korean Patent Laid-Open Publication No. 2005-0067227

SUMMARY

An aspect of the present disclosure may provide a power semiconductor device and a method of fabricating the same, allowing for a reduction in gate-collector capacitance.

According to an aspect of the present disclosure, a power semiconductor device may include: a first conductivity type first semiconductor region; a second conductivity type second semiconductor region formed on an upper portion of the first semiconductor region; a first conductivity type third semiconductor region formed in an upper inner side of the second semiconductor region; a trench gate formed to penetrate through a portion of the first semiconductor region from the third semiconductor region; and a first conductivity type fourth semiconductor region formed below the second semiconductor region while being spaced apart from the trench gate.

An impurity concentration of the fourth semiconductor region may be higher than that of the first semiconductor region.

The fourth semiconductor region may be formed in a location in which the first semiconductor region is in contact with the second semiconductor region.

The power semiconductor device may further include: a second conductivity type fifth semiconductor region formed in an upper portion of the second semiconductor region and having an impurity concentration higher than that of the second semiconductor region.

The fifth semiconductor region may provide a channel through which holes are transferred.

The fifth semiconductor region may be formed to be in contact with the fourth semiconductor region.

According to another aspect of the present disclosure, a method of fabricating a power semiconductor device may include: preparing a first conductivity type first semiconductor region; forming a trench gate by etching the first semiconductor region; forming a second semiconductor region by implanting second conductivity type impurities into an upper portion of the first semiconductor region; forming a fourth semiconductor region by implanting first conductivity type impurities into a lower portion of the second semiconductor region so as to be spaced apart from the trench gate; and forming a third semiconductor region by implanting the first conductivity type impurities into an upper portion of the second semiconductor region.

A concentration of the impurities implanted into the fourth semiconductor region may be higher than that of the first semiconductor region.

The fourth semiconductor region may be formed in a location in which the first semiconductor region is in contact with the second semiconductor region.

The method of fabricating a power semiconductor device may further include: forming a second conductivity type fifth semiconductor region formed in an upper region of the second semiconductor device by implanting the second conductivity type impurities between portions of the third semiconductor region, and having an impurity concentration higher than that of the second semiconductor region.

The fifth semiconductor region may provide a channel through which holes are transferred.

The fifth semiconductor region may be formed by implanting the second conductivity type impurities so as to be in contact with the fourth semiconductor region.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
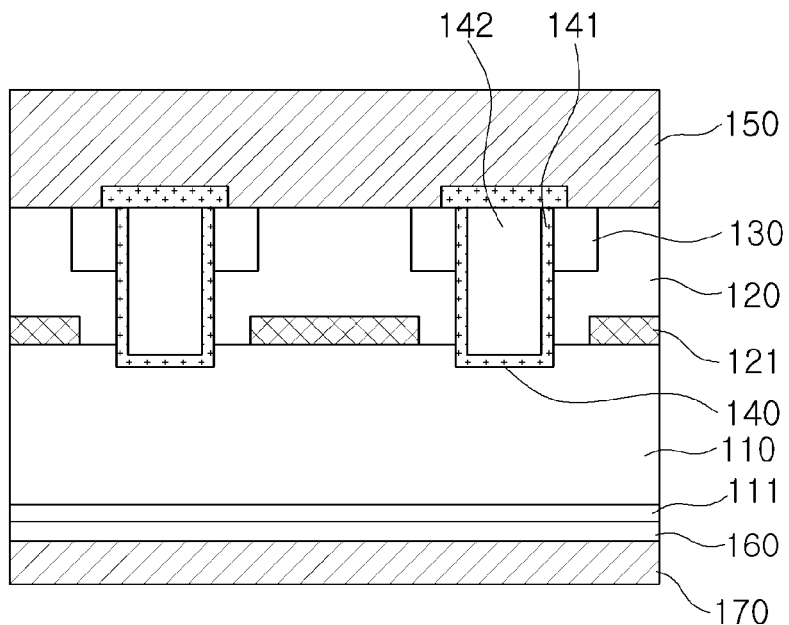
FIG. 1 is a schematic cross-sectional view of a power semiconductor device according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

A power switch may be implemented by a power MOSFET, an IGBT, various types of thyristors, or devices similar thereto. Most of new technologies disclosed herein will be described based on the IGBT. However, several exemplary embodiments of the present disclosure disclosed herein are not applied only to the IGBT, but may be applied to, for example, other types of power switch technologies including power MOSFETs and various types of thyristors in addition to the IGBT. In addition, several exemplary embodiments of the present disclosure are described as including a specific p-type region and n-type region. However, several exemplary embodiments of the present disclosure may be similarly applied to a device in which conductivity types of several regions disclosed herein are opposite to each other.

Further, an n-type and a p-type used herein may be defined as a first conductivity type and a second conductivity type. Meanwhile, the first conductivity type and the second conductivity type mean different conductivity types.

Further, generally, a positive state "+" is a high-concentration doped state and negative '−' state is a low-concentration doped state.

Hereinafter, for clarity of description, the first conductivity refers to n-type conductivity and the second conductivity type refers to p-type conductivity, but the present disclosure is not limited thereto.

Further, a first semiconductor region refers to a drift region, a second semiconductor region refers to a well region, and a third semiconductor region refers to an emitter region, but the present disclosure is not limited thereto.

Further, a fourth semiconductor region refers to a hole accumulation region and a fifth semiconductor region refers to a hole bypass region, but the present disclosure is not limited thereto.

FIG. 1 illustrates a schematic cross-sectional view of a power semiconductor device 100 according to an exemplary embodiment of the present disclosure.

The power semiconductor device 100 according to the exemplary embodiment of the present disclosure may include a drift region 110, a well region 120, an emitter region 130, and a collector region 160.

Further, the power semiconductor device 100 according to the exemplary embodiment of the present disclosure may further include a hole accumulation region 121 disposed in a lower portion of the well region 120.

The drift region 110 may be formed by implanting low concentration n-type impurities.

Therefore, the drift region 110 may have a relatively large thickness to maintain a withstanding voltage of the device.

The power semiconductor device 100 may further include a buffer region 111 below the drift region 110.

The buffer region 111 may be formed by implanting n-type impurities into a rear surface of the drift region 110.

When a depletion region of the device extends, the buffer region 111 may serve to block the extension of the depletion region, such that maintaining the withstanding voltage of the device may be facilitated.

Therefore, when the buffer region 111 is formed, a thickness of the drift region 110 may be thin, such that a miniaturization of the power semiconductor device may be implemented.

The well region 120 may be formed by implanting p-type impurities into an upper portion of the drift region 110.

The well region 120 has a p-type conductivity type to form a pn-junction with the drift region 110.

The emitter region 130 may be formed by implanting high-concentration n-type impurities into an upper inner side of the well region 120.

A trench gate 140 may be formed to the drift region 110 from the emitter region 130 by passing through the well region 120.

That is, the trench gate 140 may be formed to penetrate through a portion of the drift region 110 from the emitter region 130.

The trench gate 140 may have a gate insulating layer 141 formed on portions thereof coming into contact with the drift region 110, the well region 120, and the emitter region 130.

The gate insulating layer 141 may be formed of silicon oxide ($SiO_2$), but is not limited thereto.

An inside portion of the trench gate 140 may be filled with a conductive material 142.

The conductive material 142 may be a polysilicon (poly-si), metal, or the like, but is not limited thereto.

The conductive material 142 may be electrically connected to a gate electrode (not illustrated), such that an operation of the power semiconductor device 100 according to the exemplary embodiment of the present disclosure may be controlled.

When a positive voltage is applied to the conductive material 142, a channel is formed in the well region 120.

In detail, when a positive voltage is applied to the conductive material 142, electrons present in the well region 120 are drawn to the trench gate 140 and accordingly, are collected in the trench gate 140, thereby forming a channel.

That is, electrons and holes may be recombined due to the pn junction and thus, the trench gate 140 may draw the electrons to the depletion region having no carriers contained therein to thereby form the channel, such that a current may flow through the channel.

A lower portion of the drift region 110 or a lower portion of the buffer region 111 may be implanted with p-type impurities to thereby have the collector region 160 formed thereon.

When the power semiconductor device is an IGBT, the collector region 160 may provide holes to the device.

A conductivity modulation in which conductivity is increased by several times to hundreds of times in the drift region may occur, due to a high concentration injection of holes, minor carriers.

A resistance component in the drift region 110 is very low due to the conductivity modulation and therefore, may be used under significantly high voltage conditions.

To significantly increase a conductivity modulation phenomenon, the power semiconductor device 100 according to the exemplary embodiment of the present disclosure may further include a hole accumulation region 121.

The hole accumulation region 121 may be formed by implanting a high-concentration of n-type impurities therein.

Since the hole accumulation region 121 has the high-concentration of n-type impurities, when the power semiconductor device 100 is turned on, holes introduced from the collector region 160 are accumulated in a lower portion of the hole accumulation region 121.

That is, the holes are accumulated in the lower portion of the hole accumulation region 121, such that the conductivity modulation phenomenon may be significantly increased and an on voltage of the power semiconductor device 100 may be lowered.

Further, in the case of the trench gate type power semiconductor device 100, the trench gate 140 may be formed to penetrate through the well region 120 so as to operate the device.

However, the trench gate 140, formed to be extended into the drift region 110 based on the well region 120 may be a main cause to increase a gate-collector parasitic capacitance Cgc.

That is, in a case in which the trench gate 140 is formed to be extended into the drift region 110, when a positive voltage is applied to the conductive material 142 formed inside the trench gate 140, the electrons of the drift region 110 as well as those of the well region 110 may be also drawn to the trench gate 140.

Therefore, the electrons drawn to a portion at which the drift region 110 is in contact with the trench gate 140 affect the conductive material 142, such that the voltage applied to the trench gate 140 may be varied.

As described above, when the voltage applied to the trench gate 140 is varied, noise occurs in the power semiconductor device 140, such that reliability of the power semiconductor device may be reduced.

In particular, according to the related art, when the hole accumulation region is formed, the trench gate is inevitably in contact with the hole accumulation region.

Since the hole accumulation region is formed by implanting high-concentration n-type impurities, when the power semiconductor device is turned on, a larger number of electrons are drawn to the trench gate as compared to the case of the drift region.

Therefore, in the power semiconductor device provided with the hole accumulation region according to the related art, gate-collector parasitic capacitance is high and therefore, the occurrence of noise may be significant.

However, in the power semiconductor device 100 according to the exemplary embodiment of the present disclosure, since the hole accumulation region 121 is formed below the well region 120 while being spaced apart from the trench gate 140, the gate-collector parasitic capacitance may be significantly reduced to thereby suppress the occurrence of noise.

Further, the hole accumulation region 121 is disposed in a location in which the drift region 110 is in contact with the well region 120 to considerably increase the conductivity modulation phenomenon and considerably reduce the gate-collector parasitic capacitance.

When the power semiconductor device is a MOSFET, the collector region 160 may have an n-type conductive region.

An emitter metal layer 150 may be formed on exposed upper surfaces of the emitter region 130 and the well region 120 and a collector metal layer 170 may be formed on a lower surface of the collector region 160.

Figure 2:
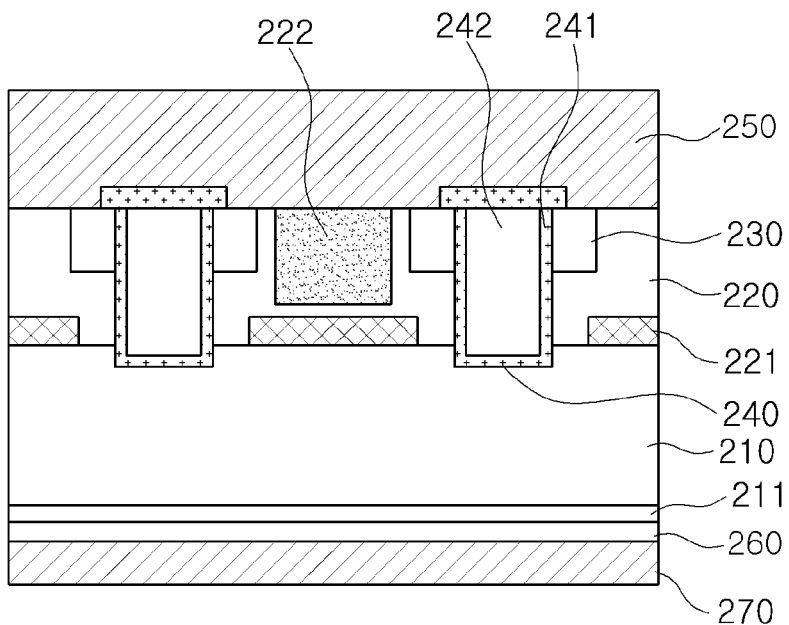
FIGS. 2 and 3 are schematic cross-sectional views of the power semiconductor device in which a hole bypass region is formed, according to the exemplary embodiment of the present disclosure.

FIG. 2 illustrates a schematic cross-sectional view of a power semiconductor device 200 according to another exemplary embodiment of the present disclosure.

Referring to FIG. 2, the power semiconductor device 200 according to another exemplary embodiment of the present disclosure may further include a hole bypass region 222, disposed in an upper portion of a well region 220.

The hole bypass region 222 may be formed by implanting high-concentration p-type impurities.

In the power semiconductor device 200 according to another exemplary embodiment of the present disclosure, since a hole accumulation region 221 is disposed in a lower portion of the well region 220, a larger number of holes are accumulated in a lower portion of the hole accumulation region 221 as compared to the case of a general device.

Therefore, when the power semiconductor device 200 performs a switching operation, a channel through which holes are rapidly transferred may be required.

The hole bypass region 222 may provide the channel through which the holes accumulated in the lower portion of the hole accumulation region 221 are transferred at the time of the switching operation of the power semiconductor device 200, such that switching performance of the power semiconductor device 200 may be improved.

Figure 3:
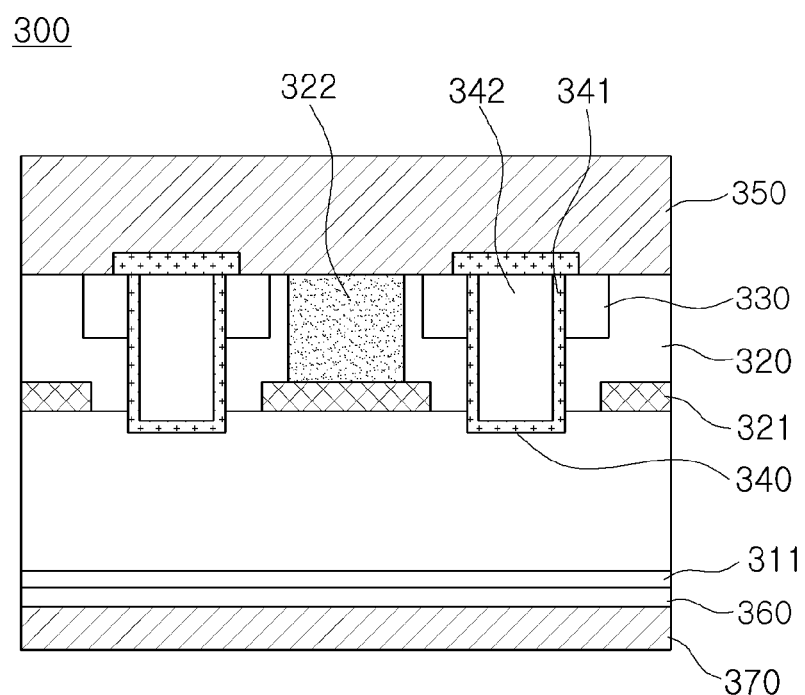

FIG. 3 illustrates a schematic cross-sectional view of a power semiconductor device 300 according to another exemplary embodiment of the present disclosure.

Referring to FIG. 3, a hole bypass region 322 formed in an upper portion of a well region 320 may be in contact with a hole accumulation region 321.

The hole bypass region 322 is formed in the well region 320 to be in contact with the hole accumulation hole 321, and therefore, holes may be further rapidly transferred through the hole bypass region 322.

Therefore, the switching performance of the power semiconductor device 300 according to another exemplary embodiment of the present disclosure may be improved.

Figure 4:
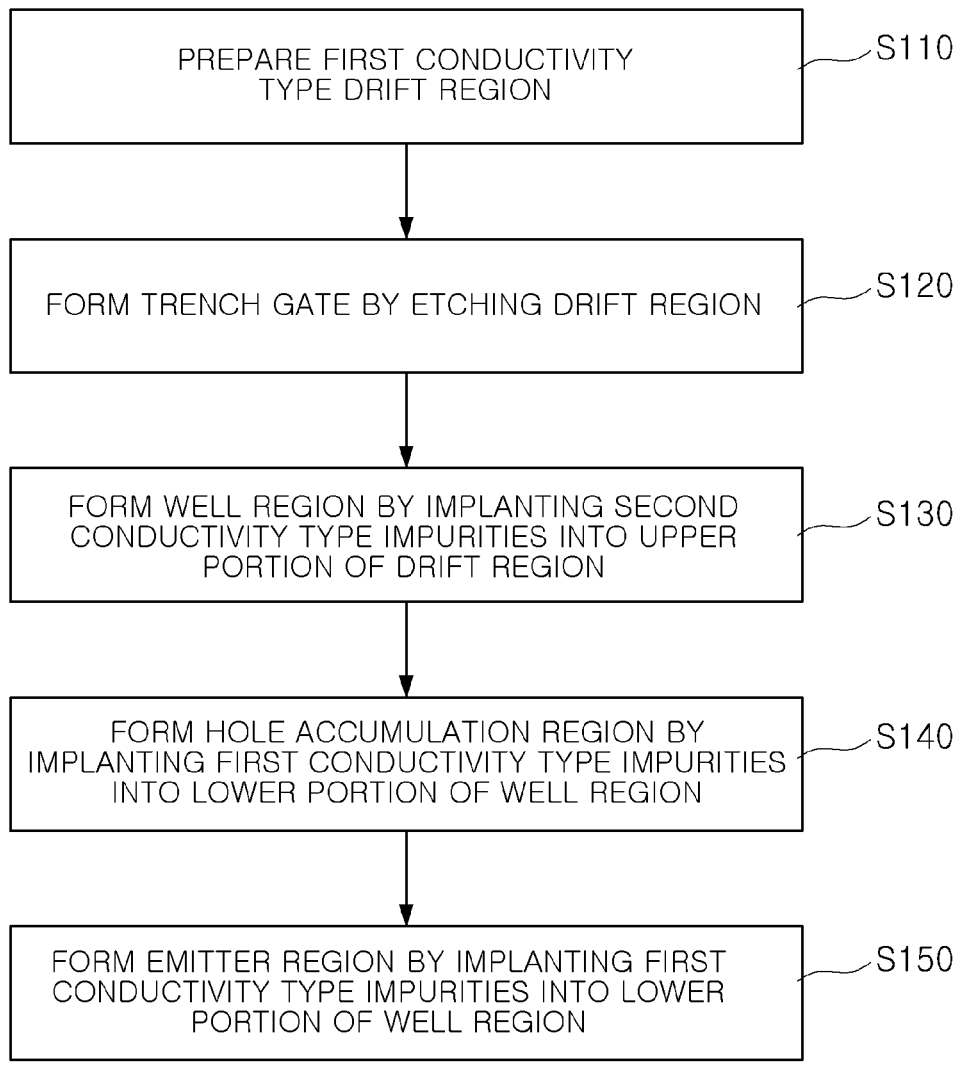
FIG. 4 is a flowchart schematically illustrating a method of fabricating a power semiconductor device according to another exemplary embodiment of the present disclosure.

FIG. 4 schematically illustrates a flow chart of a method of fabricating a power semiconductor device according to an exemplary embodiment of the present disclosure.

The method of fabricating a power semiconductor device according to the exemplary embodiment of the present disclosure will be described with reference to FIG. 4. The method of fabricating a power semiconductor device according to the exemplary embodiment of the present disclosure may include: preparing an n-type conductivity drift region (S110); forming a trench gate by etching the drift region (S120); forming a well region by implanting p-type impurities into an upper portion of the drift region (S130): forming a hole accumulation region by implanting n-type impurities into a lower portion of the well region so as to be spaced apart from the trench gate (S140); and forming an emitter region by implanting the n-type impurities into an upper portion of the well region (S150).

First, the preparing of the n-type conductivity drift region (S110) may be performed.

The preparing of the drift region (S110) may be performed by an epitaxial method and may be performed to have low-concentration n-type impurities.

After the drift region is formed, the forming of the trench gate in the upper portion of drift region (S120) may be performed.

The forming of the trench gate (S120) may include etching the upper portion of the drift region, forming a gate insulating layer on a surface of the trench gate, and filling an internal portion of the trench gate with a conductive material.

After the forming of the trench gate (S120), the forming of the well region (S130) by implanting the p-type impurities into the upper portion of the drift region may be performed.

Next, the forming of the hole accumulation region by implanting the n-type impurities into the lower portion of the well region so as to be spaced apart from the trench gate (S140) may be performed.

To form the hole accumulation region so as to be spaced apart from the trench gate, a mask may be formed above the well region.

In the forming of the hole accumulation region (S140), high-concentration n-type impurities may be implanted between the already formed trench gate portions in a high energy state.

The concentration of the n-type impurities implanted into the hole accumulation region may be higher than that of the drift region.

Since the concentration of the n-type impurities implanted into the hole accumulation region is high, holes are accumulated in the lower portion of the hole accumulation region at the time of the turn on operation of the device and thus the conductivity modulation phenomenon may be significantly increased.

After the n-type impurities are implanted, heat treatment is performed and thus the, n-type impurities are diffused, such that the hole accumulation region may be formed.

Further, the n-type impurities are diffused by performing the heat treatment and thus, the hole accumulation region may be formed in the location in which the well region is in contact with the drift region.

After the forming of the hole accumulation region (S140) is performed, the forming of the emitter region by implanting the n-type impurities into the upper portion of the well region (S150) may be performed.

The forming of the emitter region (S150) may be performed by forming the mask over the well region and implanting the n-type impurities into the portion in which the mask is not formed.

The forming of the emitter region (S150) may be performed and prior to the forming of the emitter metal layer on the emitter region, the forming of the hole bypass region by implanting second conductivity type impurities into the upper portion of the emitter region may be performed.

Since the hole bypass region may provide the channel through which the holes may be transferred, switching performance of the device may be improved.

To form the hole bypass region, the heat treatment may be performed after the second conductivity type impurities are implanted.

Therefore, the p-type impurities in the hole bypass region are diffused and thus may be in contact with the hole accumulation region.

After the emitter metal layer is formed, the collector layer may be formed by implanting the second conductivity type impurities into the rear surface of the emitter metal layer.

Prior to the forming of the collector layer, the buffer region may be formed by implanting the first high-concentration conductivity type impurities into the rear surface of the collector layer.

After the collector layer is formed, the collector metal layer may be formed on the lower surface of the collector layer.

As set forth above, according to the exemplary embodiments of the present disclosure, the power semiconductor device may allow for a reduction in gate-collector capacitance by forming the hole accumulation layer so as to be spaced apart from the trench gate.

As gate-collector capacitance is reduced, the occurrence of noise may be reduced when the power semiconductor device according to the exemplary embodiment of the present disclosure performs a switching operation.

While exemplary embodiments have been shown and described above, it will be apparent to those skilled in the art that modifications and variations could be made without departing from the spirit and scope of the present disclosure as defined by the appended claims.

What is claimed is:

1. A power semiconductor device, comprising:
 a first conductivity type first semiconductor region;
 a second conductivity type second semiconductor region disposed on an upper portion of the first semiconductor region;
 a first conductivity type third semiconductor region disposed in an upper inner side of the second semiconductor region;
 a trench gate penetrating through a portion of the first semiconductor region from the third semiconductor region;
 a first conductivity type fourth semiconductor region disposed below the second semiconductor region while being spaced apart from the trench gate; and
 a fifth semiconductor region formed in an upper portion of the second semiconductor region and formed to be in contact with the fourth semiconductor region.

2. The power semiconductor device of claim 1, wherein an impurity concentration of the fourth semiconductor region is higher than that of the first semiconductor region.

3. The power semiconductor device of claim 1, wherein the fourth semiconductor region is formed in a location in which the first semiconductor region is in contact with the second semiconductor region.

4. The power semiconductor device of claim 1, wherein the fifth semiconductor region has an impurity concentration higher than that of the second semiconductor region.

5. The power semiconductor device of claim 4, wherein the fifth semiconductor region provides a channel through which holes are transferred.

6. The power semiconductor device of claim 1, wherein the fourth semiconductor region is disposed to be in contact with the first semiconductor region and the second semiconductor region.

* * * * *